United States Patent [19]

Hudspeth et al.

[11] Patent Number: 4,783,639

[45] Date of Patent: Nov. 8, 1988

[54] WIDEBAND MICROWAVE DIPLEXER INCLUDING BAND PASS AND BAND STOP RESONATORS

[75] Inventors: Thomas Hudspeth, Malibu; Fritz Steinberg, Culver City, both of Calif.

[73] Assignee: Hughes Aircraft Company, Los Angeles, Calif.

[21] Appl. No.: 800,241

[22] Filed: Nov. 21, 1985

[51] Int. Cl.[4] .............................................. H03H 7/46

[52] U.S. Cl. .................................... 333/126; 333/135

[58] Field of Search ................. 333/126, 129, 134–137

[56] References Cited

U.S. PATENT DOCUMENTS

| | | | |
|---|---|---|---|
| 2,626,990 | 1/1953 | Pierce | 333/135 |
| 3,428,918 | 2/1969 | Matthaei | 333/135 |
| 3,543,189 | 11/1970 | Standby | 333/135 |
| 3,668,564 | 6/1972 | Ren et al. | 333/135 |
| 4,168,478 | 9/1979 | Schuegraf | 333/135 |
| 4,410,866 | 10/1983 | Bui-Hai | 333/135 |
| 4,427,953 | 1/1984 | Hudspeth et al. | 333/134 |

FOREIGN PATENT DOCUMENTS

| | | | |
|---|---|---|---|
| 2338584 | 2/1975 | Fed. Rep. of Germany | 333/208 |
| 843341 | 8/1960 | United Kingdom | 333/208 |

*Primary Examiner*—Eugene R. LaRoche
*Assistant Examiner*—Benny Lee
*Attorney, Agent, or Firm*—S. M. Mitchell; M. J. Meltzer; A. W. Karambelas

[57] ABSTRACT

A wideband microwave diplexer is provided which includes a waveguide section characterized by a longitudinal dimension, and defining first and second longitudinally spaced ports, for propagating microwave power substantially within a first lower frequency band between said first port and said second port; coupling resonator means for coupling microwave power substantially within a second higher frequency band between said waveguide section and a coaxial transmission line; and band stop filter means for substantially preventing microwave power substantially within the second frequency band from propagating to said second port.

20 Claims, 4 Drawing Sheets

Fig. 1.
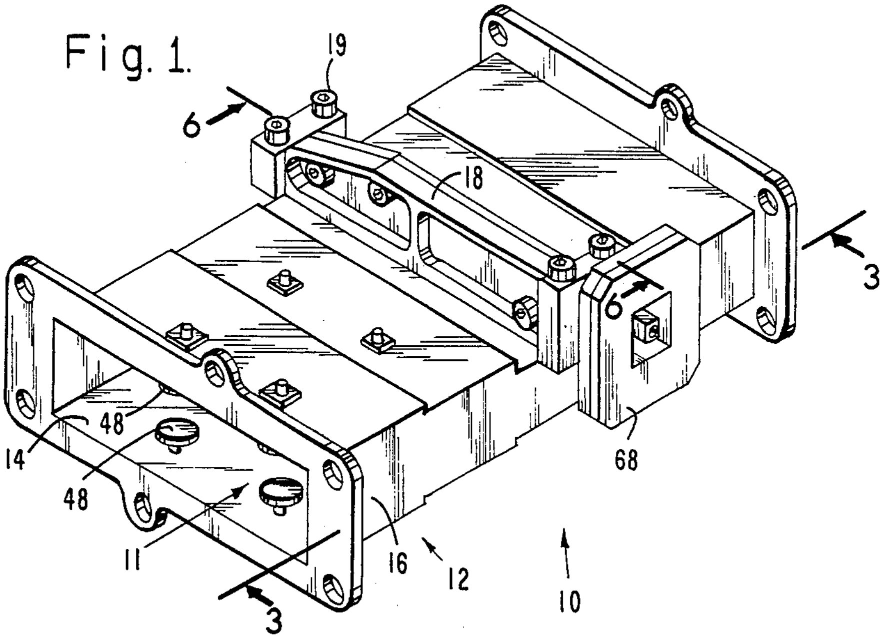
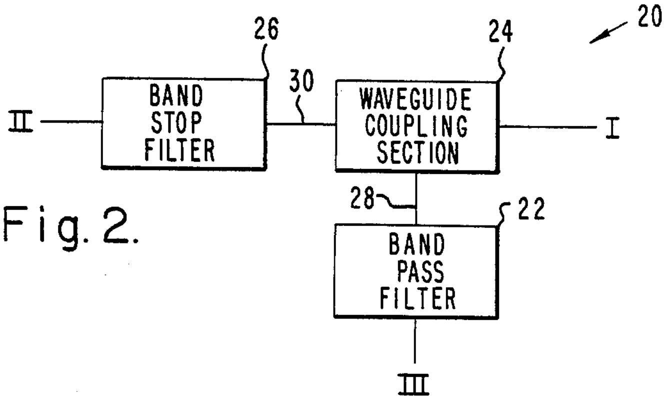
Fig. 2.
Fig. 3.
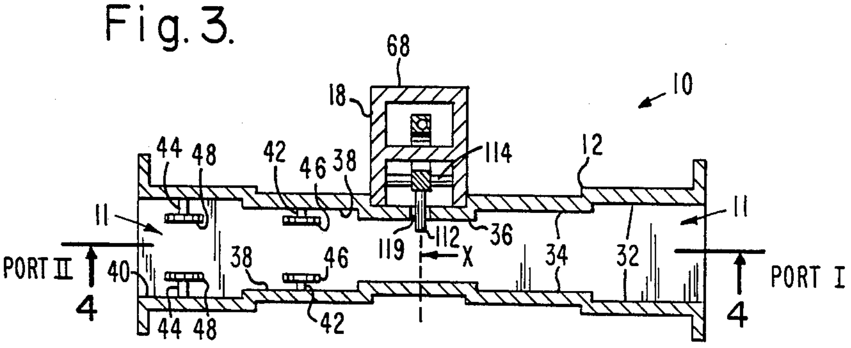

WIDEBAND MICROWAVE DIPLEXER INCLUDING BAND PASS AND BAND STOP RESONATORS

BACKGROUND OF THE INVENTION

1. Field of the Invention

The present invention relates to microwave power couplers and diplexers and more particularly to transmission line to waveguide diplexers.

2. Description of the Related Art

Communications satellites often employ reflector-type antennas to transmit and receive information-carrying microwave frequency power. Generally, an array of microwave feed horns communicates microwave power between such an antenna reflector and satellite signal processing systems. Information-carrying microwave power to be transmitted by the satellite is provided by transmitter signal processing systems to the feed horn array which directs the transmitted power to the reflector antenna which in turn reflects the transmitted power to a prescribed region on the surface of the earth, and information-carrying microwave power received by the satellite from the earth is reflected by the reflector antenna to the feed horn array which directs the received power to appropriate receiver signal processing systems.

Typically, transmitted and received microwave power occupies different frequency bands in order to maintain adequate signal isolation. For example, the transmitted power might be in a frequency band centered at about 4 GHz, and the received power might be in another frequency band centered at about 6 GHz. Since the same feed horn array conducted power in both frequency bands, means were provided for coupling the respective 4 GHz transmitted power and the 6 GHz received power between the feed horn array and the respective separate transmitter and receiver signal processing systems. Earlier means for coupling power in two such frequency bands are well known. For example, Hudspeth et al, in U.S. Pat. No. 4,533,884 issued on Aug. 6, 1985 discloses a coaxial line to waveguide adaptor suitable for coupling power at approximately 4 GHz and 6 GHz.

More recently, however, there has been a need for communications satellites in which a single reflector antenna and associated feed horn array conducts microwave power in more than two frequency bands which are substantially far apart in the frequency spectrum. For example, in one satellite there is a need for a single reflector antenna and feed horn array which simultaneously can conduct power in a 4 GHz band, a 6 GHz band and a frequency band centered at about 12 GHz. Consequently, there has been a need for coupling means for coupling microwave power in at least two frequency bands which are relatively far apart in the frequency spectrum between a feed horn array and separate ignal processing systems associated with the respective frequency bands.

The provision of such a coupling means, however, presents numerous problems. For example, coupling power in the 12 GHz band to a microwave coupler suitable for conducting power in the 4 GHz and 6 GHz bands could result in distorted antenna horn patterns in the 12 GHz band if unwanted modes were not substantially prevented. Furthermore, unwanted reflections of power in the 4 GHz and 6 GHz bands due to mismatches resulting from components used to couple microwave power in the 12 GHz band should be prevented. Finally, power in the 12 GHz band should be made to propagate between the reflector antenna and the feed horn array and not toward the respective signal processing systems for power in the 4 GHz and 6 GHz bands.

Thus, there has been a need for a coupler suitable for coupling information-carrying microwave power in at least two frequency bands which are substantially far apart in the frequency spectrum between a feed horn array and respective signal processing systems for the respective frequency bands. The present invention meets this need.

SUMMARY OF THE INVENTION

In one embodiment, the present invention comprises an elongated rectangular waveguide defining first and second waveguide ports at opposite ends thereof. The waveguide is dimensioned to propagate microwave power substantially within a first lower frequency band between the first and second ports. A coupling resonator is included for transmitting microwave power substantially within a second higher frequency band between the first waveguide port and a coaxial transmission line. Furthermore, a band stop filter is included for substantially preventing microwave power substantially within the second higher frequency band from propagating to the second waveguide port.

The present invention provides a wideband microwave diplexer for coupling to a single port, microwave power in at least two frequency bands which can be relatively far apart in frequency. Neither microwave power substantially within the first lower frequency band nor microwave power substantially within the second higher frequency band, however, can propagate between the second waveguide port and a third port which includes the coupling resonator. Furthermore, a preferred embodiment of the invention substantially prevents propagation of microwave power in either frequency band in modes other than selected desired modes.

These and other features and advantages the present invention will be apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which:

FIG. 1 is a perspective view of a presently preferred embodiment of the invention;

FIG. 2 is a functional block diagram of the embodiment of FIG. 1;

FIG. 3 is a vertical section view along line 3—3 of FIG. 1;

DETAILED DESCRIPTION OF THE EMBODIMENT

Figure 4:
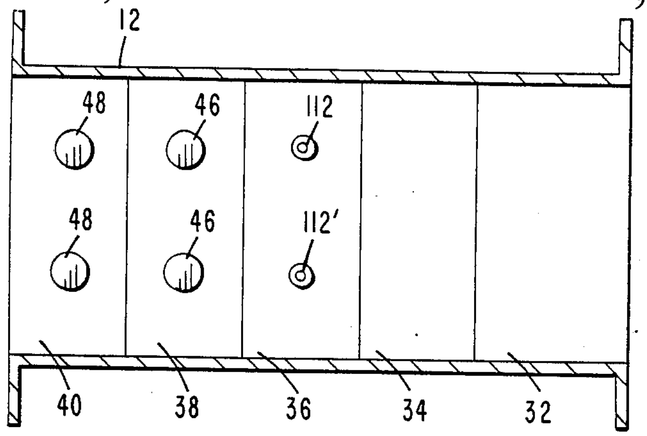
FIG. 4 is a horizontal section view along line 4—4 of FIG. 3.

The present invention comprises a novel wideband microwave diplexer. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Referring to FIG. 1, an illustrative perspective view of a presently preferred embodiment of a wideband microwave diplexer 10 of the present invention is shown. The diplexer 10 comprises a rectangular waveguide section 12 defining a microwave cavity 11 and having a rectangular cross section and parallel opposed facing broad walls 14 and parallel opposed facing narrow walls 16. The diplexer 10 also includes a launcher housing 18 which is secured to the waveguide section by suitable means such as by screws 19. The waveguide section 12 is formed from a conducting material such as a silver plated aluminum, and the launcher housing 18 is formed from a conducting material such as gold plated aluminum.

A brief discussion of the functional block diagram 20 of FIG. 2 which functionally illustrates the performance of the diplexer 10 of FIG. 1 will facilitate an understanding of the more detailed description of the diplexer 10 which follows. More particularly, the functional block diagram 20 illustrates a band pass filter 22, a waveguide coupling section 24, and a band stop filter 26. Line 28 represents an electrical path between the band pass filter 22 and the waveguide coupling section 24, and line 30 represents an electrical path between the waveguide coupling section 24 and the band stop filter 26.

The diagram 20 also illustrates three ports, each of which is suitable for transmitting or receiving microwave power. The ports are labelled I, II and III. The waveguide coupling section 24 and the band stop filter 26 are interposed between port I and port II. The band pass filter 22 is interposed between port III and the waveguide coupling section 24. The electrical path between port I and port II conducts microwave power substantially within two frequency bandwidths: 3.7–4.2 GHz (hereinafter, 4 GHz band) and 5.925–6.425 GHz (hereinafter, 6 GHz band). Band pass filter 22 passes microwave power substantially within a 11.775–12.275 GHz bandwidth (hereinafter, 12 GHz band). It will be appreciated that a bandwidth extending from 3.7 GHz to 6.425 GHz is relatively far apart in the microwave frequency spectrum from a bandwidth extending from 11.775 GHz to 12.275 GHz. The waveguide coupling section 24 propagates microwave power substantially within the 12 GHz band. Band stop filter 26 rejects microwave power substantially within the 12 GHz band. The electrical path between port I and port III, therefore, conducts microwave power substantially within the 12 GHz band, but the electrical path between port II and port III does not conduct microwave power substantially within the 12 GHz band.

The electrical path between ports I and II comprises waveguide; while the electrical path between port III and the waveguide coupling section 24 comprises square coaxial transmission line and probe coupling to waveguide. Thus, the waveguide coupling section 24 provides a transition between transmission line propagation and waveguide propagation for microwave power substantially within the 12 GHz band.

Table I summarizes the features and performance of the novel diplexer 10 of FIG. 1 as illustrated by the functional block diagram 20 of FIG. 2:

TABLE I

| Port | Frequency Bands (GHz) | Terminal Transmission Type | Connected Port | Isolated Port |
|---|---|---|---|---|
| I | 11.775-12.275 | waveguide | III | II |
| II | 3.7-4.2,5.925-6.425 | waveguide | I | III |
| III | 11.775-12.275 | coaxial transmission line | I | II |

Referring to FIGS. 1 and 3, the waveguide section 12 defines ports I and II which are rectangular openings longitudinally spaced from one-another at opposite ends of the waveguide section 12. The dimensions of the respective openings are substantially determined by the dimensions of the broad walls 14 and narrow walls 16 adjacent to the respective ports. The waveguide section 12 is segmented into a series of longitudinally spaced sections called steps, each of which has a different characteristic narrow wall dimension, the broad wall dimension for each of the steps being the same. The physical dimensions of the step segments are selected to provide a step transforme which provides minimum mismatch for microwave power substantially within the bandwidth including the 4 GHz and 6 GHz bands (commonly known as C-band).

A first step 32 extends longitudinally from a lip of port I for a distance of approximately 0.754 inches which is approximately one-quarter of a mean waveguide wavelength for the bandwidth including the 4 Ghz and 6 GHz bands. The narrow wall dimension for the first step 32 is approximately 0.547 inches. A second step 34 extends longitudinally from the edge of the first step 32 for a distance of approximately 0.751 inches. The narrow wall dimension of the second step 34 is approximately 0.471 inches. A third step 36 extends longitudinally from the edge of the second step 34 for a distance of approximately 0.722 inches. The narrow wall dimension of the third step 36 is approximately 0.415 inches. A fourth step 38 extends longitudinally from the edge of the third step 36 for a distance of 0.751 inches. The narrow wall dimension of the fourth step 38 is approximately 0.471 inches. A fifth step 40 extends longitudinally from the edge of the fourth step 38 for a distance of approximately 0.754 inches. The narrow wall dimension of the fifth step 40 is approximately 0.547 inches. The broad wall dimensions of the respective first, second, third, fourth and fifth steps, 32, 34, 36, 38 and 40 all are approximately 1.950 inches.

Referring now to FIGS. 3 and 4, a first set of four resonant posts 42 are shown depending perpendicularly from the broad walls of the fourth step 38 within the microwave cavity 11 defined by the microwave section 12, and a second set of four resonant posts 44 are shown depending perpendicularly from the broad walls 14 of the fifth step 40 within the microwave cavity 11 defined by the microwave section 12. The first and second sets of resonant posts 42 and 44 respectively are dimensioned and positioned, as will be more fully described below, so as to reject signals substantially within the 12 GHz band (commonly known as Ku-band) Thus, the first and second sets of resonant posts 42 and 44 respectively comprise the band stop filter 26 functionally illustrated in FIG. 2.

Two of the posts 42 from the first set depend from each of the two broad walls 14 of the fourth step 38. Each respective post 42 is spaced substantially onethird of the broad wall dimension from the respective adjacent narrow wall, and each post 42 is equidistant from the adjacent edge of the fifth step 40. Furthermore, each respective resonant post 42 includes a disc-shaped head 46 centrally secured to the top of the respective post 42 such that the plane of the head 46 is substantially parallel to the planes of the broad wall segments of the fourth step 38. The length of each post 42 is approximately 0.050 inches, and the diameter of each post 42 is approximately 0.060 inches. The diameter of each disc-shaped head 46 is approximately 0.250 inches, and the thickness of each head 46 is approximately 0.020 inches.

Similarly, two of the posts 44 from the second set depend from each of the two broad walls 14 of the fifth step 40. Each respective post 44 is spaced substantially one-third of the broad wall dimension from the adjacent narrow wall 16, and each post 44 is equidistant from the adjacent edge of the fourth step 38. Furthermore, each respective resonant post 44 includes a disc-shaped head 48 centrally secured to the top of the respective post 44 such that the plane of the head 48 is substantially parallel to the planes of the broad wall segments of the fifth step 40. The length of each post 44 is approximately 0.075 inches, and the diameter of each post 44 is approximately 0.060 inches. The diameter of each disc-shaped head 48 is approximately 0.200 inches, and the thickness of each head 48 is approximately 0.020 inches The spacing of each post 42 of the first set from each post 44 of the second set relative to the longitudinal axis of the waveguide section 12 is approximately three-quarter waveguide wavelengths of the center frequency of the 12 GHz band which is approximately 0.761 inches.

Figure 5:
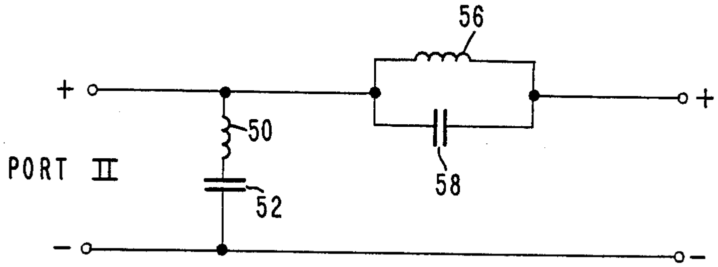
FIG. 5 is an illustrative circuit diagram of a band stop filter of the embodiment of FIG. 1.

It will be understood that the respective first and second sets of resonant posts 42 and 44 and their respective disc-shape heads 46 and 48 each comprise a resonator substantially tuned to the center frequency of the 12 GHz band, and that the above-described three-quarter wavelength longitudinal separation of the two sets provides the desired band stop filter performance for the 12 GHz band. FIG. 5 schematically models the electrical behavior of the waveguide band stop filter 26 from a location generally indicated by the tip of the arrow labelled x in FIG. 3. The two sets together comprise a first inductor 50 and a first capacitor 52 electrically connected in series with one-another across respective positive and negative terminals of the second port as shown. The two sets also comprise a second inductor 56 and a second capacitor 58 electrically connected in parallel with one-another, the second inductor 56 and the second capacitor 58 each also being individually connected in series between the respective positive terminals as shown. It will be appreciated that the circuit parameters of the illustrative circuit are selected to obtain a desired stop bandwidth, and that the circuit parameters are determined by the dimensions and spacing of the respective posts 42 and 44 and their respective heads 46 and 48.

Figure 6:
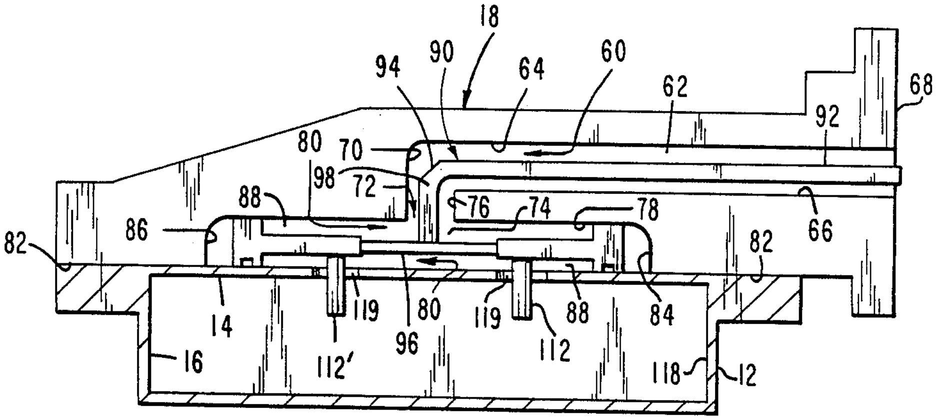
FIG. 6 is a vertical section view along line 6—6 of FIG. 1.

As will be more fully described below, the band pass filter 22 and the waveguide coupling section 24 functionally illustrated in FIG. 2 comprise a transmission line and waveguide network for communicating microwave power in the 12 GHz band with the waveguide section 12. More particularly, referring to the exemplary drawings of FIG. 6, a sectional view generally along line 6—6 of FIG. 1 is provided; line 6—6 divides the launcher housing 18 into two substantially identical or substantially mirror image halves. The illustrative drawinqs of FIG. 6 show the launcher housing 18 with an elonqated straightline U-shaped first channel 60 formed therein. The width of a base wall 62 which defines the base of the first channel 60 equals twice the heights of respective first and second side walls 64 and and 66 (as viewed along the plane of line 6—6 of FIG. 6) which upstand perpendicularly from opposite sides of the base wall 62 and define the sides of the first channel 60. The first channel 60 extends longitudinally in a straioht line from a portion of the launcher housing 18 comprising a connector plate face 68 at one end of the first channel 60, wherein the first channel 60 forms a U-shaped indent, and a first slot end wall 70 at a longitudinally spaced opposite end.

The first channel end wall 70 extends in a direction perpendicular to that of the respective first and second side walls 64 and 66 and has a height equal to the heights of the respective first and second side walls 64 and 66. The end wall 70 also serves as one side wall of a relatively short second channel 72 which intersects with the first channel 60, resides in the plane thereof and extends in a direction perpendicular thereto. A base wall 74 which defines the base of the second channel 72 has a width equal to twice of the heights of the end wall 70 and a short side wall 76 which upstand perpendicularly from opposite sides of the base wall 74 and define the sides of the short second channel 72. The longitudinal dimension of the short channel 72 is significantly less than that of the long slot 60.

The short channel 72 bisects a side wall 78 of an elongated notch 80 formed in the base side 82 of the launcher housing 18. The notch 80 is bounded on its respective ends by respective first and second end walls 84 and 86. A base wall 88 of the notch lies in the same planes as the respective base walls 62 and 74 of the respective first and second channels 60 and 72. The width of the notch base wall 88 measured from the bisected side wall 78 to the edge of a bottom side 82 of the launcher housing 18 is equal to the widths of the respective base walls 62 and 74 of the first and second channels 60 and 72. Furthermore, the bisected side wall 78 upstands perpendicularly along an edge of the notch base wall 88 distal from the bottom side 82 of the notch 80, and it extends in a direction parallel to the respective first long slot side walls 64 and 66. The respective first and second end walls 84 and 86 of the notch 80 upstand perpendicularly from opposite ends of the notch base wall 88 between the bisected side wall 78 and the bottom side 82 of the launcher housing 18. The respective end walls 84 and 86 of the notch 80 each extend in a direction parallel to the direction of the first channel end wall 70. The heights of the bisected end wall 78 and the respective notch end walls 84 and 86 of the notch 80 all are equal to the heights of the first channel end wall 70.

One will appreciate that the portion of the launcher housing 18 just described comprises only one-half of the launcher housing 18. The other half comprises substantially a mirror image of the portion just described such that the two halves together comprise substantially the entire launcher housing 18. Thus, the complete launcher housing 18, including both halves, defines an elongaed first passage having a square cross-section comprising the first channel 60 and a mirror image thereof, which extends from the connector plate face 68, wherein it forms a square opening, to the first channel end wall 70. The complete launcher housing 18 also defines a second passage significantly shorter than the first passage which also has a square cross-section, comprising the second channel 72 and a mirror image thereof, which extends in a direction perpendicular to the direction of the first passage. The complete launcher housing 18 also defines an elongated generally U-shaped bottom channel, comprising the notch 80 and a mirror image thereof, which extends in a direction parallel to the elongated first passage. The second passage opens into the U-shaped bottom channel near the longitudinal center of the top cross-wall thereof.

Figure 7:
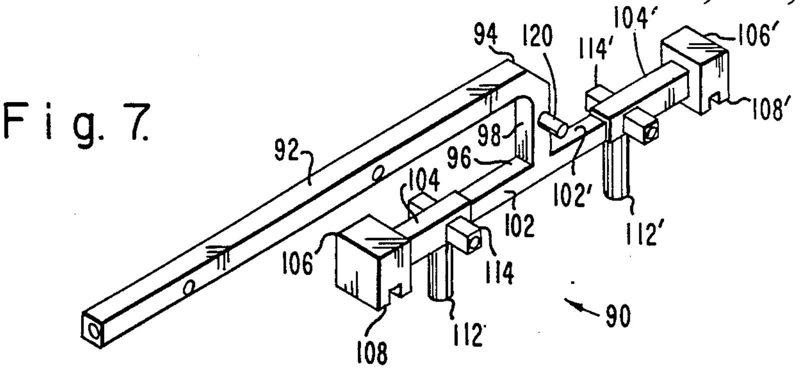
FIG. 7 is a perspective view of a center conductor of the embodiment of FIG. 1.

Thus, in the complete launcher housing 18, the width of each wall defining the first and second passages and the bottom U-shaped slot substantially equals the width of the base wall 62 of the first channel 60 which measures approximately 0.160 inches Referring once again to FIG. 6, a center conductor indicated generally by the numeral 90 resides within the respective first and second channels 60 and 72 and within the notch 80. The center conductor 90 is formed from a conducting material such as silver plated beryllium copper. Referring now to FIGS. 6 and 7, the center conductor 90 comprises an elongated substantially straight segment 92 which resides in the first channel 60 and extends between the housing face plate 68 and the first channel end and wall 70. The center conductor 90 includes a chamfer 94 which resides at the junction of the first channel 60 and the perpendicularly oriented second channel 72. Furthermore, the center conductor 90 comprises a generally T-shaped band pass resonator portion 96 comprising first and second band pass resonators which will be described more fully below. The elongated segment 92 and the chamfer 94 have substantially square cross-sections measuring approximately 0.0640 inches on each side.

A relatively short center conductor segment 98 depends from the chamfer 94 in a direction substantially perpendicular to the longitudinal dimension of the elongated segment 92. The short segment 98 has a substantially square cross-section with side dimensions substantially equal to those of the elongated segment 92 and the chamfer 94. It will be appreciated from the drawings of FIG. 6 that the short segment 98 resides in part in the relatively short second channel 72.

The short segment 98 branches into an integral dual resonator dipole assembly which has a longitudinal dimension which extends in a direction parallel to the longitudinal dimension of the elongated segment 92. The dipole assembly comprises two branches which are substantially mirror images of one another and which are symmetrical with respect to the point of intersection of the short segment 98 and the dipole assembly. The short segment 98 and the dipole assembly together comprise the T-shaped band pass resonator portion 96.

Since the two branches of the dipole assembly are substantially mirror images of one-another, only one branch need be described in detail. More particularly, from FIGS. 6 and 7 it will be appreciated that one branch extends in a longitudinal direction between the short segment 98 and an end of the elongated segment 92 adjacent to the housing face plate 68. A first branch segment 102 extends from the short segment 98 parallel to the elongated segment 92. The short segment 98 has a substantially square cross section. It measures approximately 0.046 inches on a side and has a longitudinal dimension of approximately 0.235 inches. The first branch segment 102 is interrally attached to a second branch segment 104 which depends from an end of the first branch segment 102 distal from the short segment 102 and which extends longitudinally in the same direction as the first branch segment 102. The second branch segment 104 has a substantially square cross section, and measures approximately 0.064 inches on a side. Its longitudinal dimension is appoximately 0.342 inches.

The second branch segment 104 terminates in an integrally connected rectangular block support 106. The branch segment 104 and the block support 106 together serve as an electrical stub. The block support 106 has a dimension which extends in the direction of the elongated segment 92 which measures approximately 0.1 inches, and it has a substantially square cross section which measures approximately 0.160 inches on a side. The block support 106 forms a pair of parallel lands 108 which extend in a direction transverse to the longitudinal dimension of the elongated segment 92. The lands 108 can serve to support a gasket (not shown) to prevent the escape of RF energy.

A substantially cylindrical dipole leg 112 depends from the second branch segment 104 adjacent to the juncture of the respective first and second branch segments 102 and 104. The dipole leg 112 extends in a direction generally parallel to the short segment 98 and away from the elongated segment 92. It has a diameter of approximately 0.062 inches and a length of approximately 0.213 inches.

Two generally cube-shaped posts 114 depend from the second branch segment 104. The posts 114 extend from opposite sides of the second branch segment 104 such that a common axis extending through the centers of the two posts 114 extends transverse to the longitudinal dimension of the elongated section 92. The common axis of the two posts 114 intersects the central axis of the cylindrical dipole leg 112. Each post 114 measures approximately 0.054 inches on a side.

While only one branch of the two-branch dipole assembly has been described in detail, it will be appreciated that a similar description applies to the other branch. In the lieu of setting forth a detailed description of the other branch, components of the mirror-image other branch which correspond to components described above are indicated in FIGS. 6 and 7 by identically numbered primed reference numerals.

As best illustrated in FIGS. 3, 4 and 6, the launcher housing 18 with the center conductor 90 residing therein is secured by suitable means such as screws to an outward facing side of a broad wall 14 of the third step 36. The center conductor 90 is secured within the first and second passages and the bottom slot defined by the launcher housing 18 by suitable means such as dielectric spacers (not shown) formed from a material known by the trade name Ultem which is produced by the General Electric Company. The launcher housing 18 is secured to the outward facing side of the broad wall 14 such that the longitudinal dimension of the elongated segment 92 extends in a direction substantially perpendicular to the narrow walls 16 of the third step 36. Two openings 119 formed in the broad wall 14 whereupon the launcher housing 18 rests are sized and spaced apart to permit passage therethrough of the dipole legs 112 and 112'. The respective block supports 106 and 106' rest upon the outward facing side of the broad wall 14.

Each respective dipole leg 112 and 112' is spaced from the first set of resonant posts 42 by substantially three quarter-wavelengths of the mean center frequency of the 12 GHz band. It will be appreciated that the respective dipole legs 112 and 112' depend from the longitudinal center of the third step 36. Furthermore, each respective dipole leg 112 and 112' is spaced approximately one-third of the broad wall dimension from their respective adjacent narrow walls 16.

The respective posts 114 and 114' make electrical contact with the launcher housing 18. As will be appreciated from FIG. 7, an electrically conducting elongated substantially cylindrical pin 120 is rotatably secured between the short segment 98 and the launcher housing 18. The pin 120 is contoured and rotatable to provide variable location of electrical contact between the short segment 98 and the launcher housing 18, in a manner which will be understood by those skilled in the art, for tuning the frequency response of the band pass resonator portion 96. The distance measured along the respective longitudinal axes of the second branch 104 the first branch 102 and the short segment 98 between the common axis of the posts 114 and a central axis of the substantially cylindrical pin 120 is approximately one-half of the wavelength of the mean center frequency of the 12 GHz band.

Figure 8:
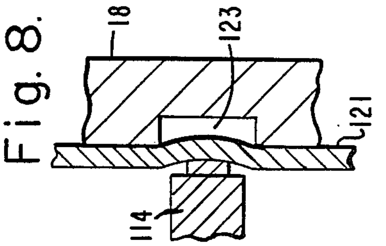
FIG. 8 is a fractional vertical section view of details of a flat spring at the electrical interface of the center conductor and a launcher housing of the embodiment of FIG. 1.

As will be appreciated from the exemplary drawings of FIG. 8, the respective posts 114 are maintained in electrical contact with the launcher housing 18 by a flat spring 121. More particularly, the flat spring 121 comprises a thin shim disposed over countersunk holes 123 (only one of which is shown) formed in an interior wall of the launcher housing 18 such that a post 114 presses the flat spring 121 against the inner walls of the launcher housing 18 adjacent to a corresponding countersink hole 123. The flat spring 121 is formed from a strong but resilient electrically conductive material such as gold plated beryllium copper which is dimpled by the post 114 pressing against it. The post 114 is formed from a harder material such as silver plated beryllium copper. The remaining posts 114', the pin 120 and the support blocks 106 and 106' contact the launcher housing 18 in a similar fashion. Thus, the center conductor 90 is suspended within the launcher housing 18 in such a fashion that proper electrical contact can be maintained between the center conductor 90 and the launcher housing 18, despite vibrational or other mechanical disturbances of the diplexer 10.

The generally T-shaped band pass resonator portion 96 comprises two band pass resonators. A first band pass resonator comprises the respective block supports 106 and 106', the respective posts 114 and 114', portions of the respective second branch segments 104 and 104' between the respective block supports 106 and 106' and the respective posts 114 and 114', and the respective dipoles 112 and 112'. A second band pass resonator comprises the respective first branch segments 102 and 102', the respective second branch segments 104 and 104', the short segment 98, the respective posts 114 and 114' and the elongated substantially cylindrical pin 120.

Figure 9:
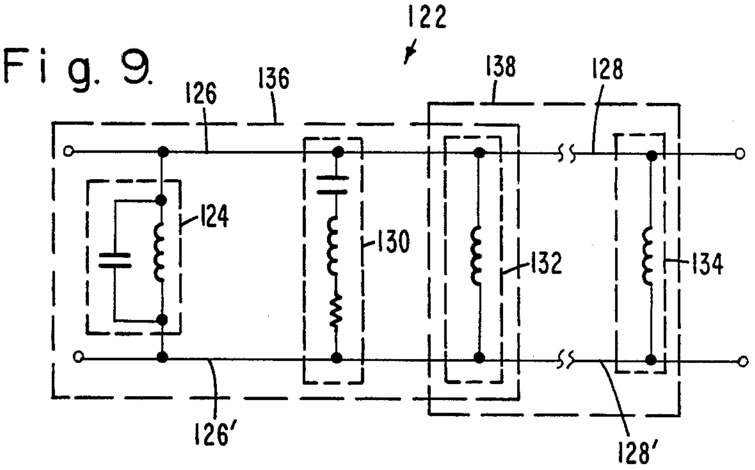
FIG. 9 is an illustrative circuit diagram for the generally T-shaped band pass resonator portion of the center conductor of FIG. 7.

FIG. 9 illustrates an exemplary electrical circuit 122 which models the performance of the two band pass resonators just described. The exemplary circuit 122 comprises a third capacitor and a third inductor electrically connected in parallel with one-another and enclosed by dashed lines labelled 124. The parallel-connected capacitor and inductor circuit within lines 124 is itself connected in parallel across lines 126 and 126'. The exemplary circuit 122 further comprises a fourth capacitor, a fourth inductor and a resistor electrically connected in series with one-another and enclosed by dashed lines labelled 130. The series-connected circuit within lines 130 is electrically connected in parallel across lines 126 and 126'. Furthermore, a fifth inductor enclosed within dashed lines labelled 132 is electrically connected in parallel across lines 126 and 126' and across lines 128 and 128'. Finally, a sixth inductor within dashed lines labelled 134 is electrically connected in parallel across lines 128 and 128'.

In the exemplary circuit, the electrical components within lines 130 and lines 132 are interposed between the electrical components enclosed within lines 124 and 134. The electrical components within lines 124 are shown electrically connected in parallel with and adjacent to the electrical componen,ts within lines 130, and the electrical components within lines 132 are shown electrically connected in parallel with and adjacent to the electrical components within lines 134. Furthermore, electrical components enclosed within lines 124, 130 and 132 are themselves enclosed within dashed lines 136, and the electrical components enclosed within lines 132 and 134 are enclosed within dashed lines 138. Thus, the fifth inductor within dashed lines 132 also is enclosed within both dashed lines 136 and dashed lines 138.

The parallel-connected third capacitor and third inductor enclosed within dashed lines 124 illustrates the electrical characteristics of the two second branch segments 104 and 104' and the two block supports 106 and 106'. Lines 126 and 126' together represent the respective first branch segments 102 and 102' and the second branch segments 104 and 104'. The series-connected fourth capacitor, fourth inductor and the resistor enclosed within dashed lines 130 illustrates the electrical characteristics of the two dipole legs 112 and 112'. The fifth inductor enclosed within dashed lines 132 illustrates the electrical characteristics of the respective four posts 114 and 114'. Lines 128 and 128' together represent the transmission line lengths between the respective posts 114 and 114' and the substantially cylindrical pin 120. The sixth inductor enclosed within dashed lines 134 illustrates the electrical characteristics of the substantially cylindrical pin 120. Therefore, it will be appreciated that dashed lines 136 enclose an exemplary electrical circuit illustrating the first band pass resonator, and dashed lines 138 enclose an exemplary electrical circuit illustrating the second band pass resonator. Thus, the cylindrical pin 120 provides mutual coupling between the second band pass resonator within dashed lines 138 and the incoming transmission line including center conductor 92. The fifth inductor within dashed lines 132 represents the respective posts 114 and 114' which are components of both the first and the second band pass resonators and which provide mutual inductive coupling between the two band pass resonators.

In operation, the first and second band pass resonators are resonant at substantially the same frequency, the mean center frequency for the 12 GHz band, and each have substantially the same bandwidth. Furthermore, the coupling is adjusted by adjustment of the posts 114 and 114' to be critical; such that impedance is substantially matched and reflections are minimized over the 12 GHz band.

The respective dipole legs 112 and 112' operate in phase, and microwave power provided on the elongated segment 92 which is within the 12 GHz band radiates from the respective dipole legs 112 and 112' into the region of the third step 36 of the waveguide section 12. Thus, the T-shaped band pass resonator portion 96 with its two matched band pass resonators as coupled to the third step 36 of the waveguide section 12 constitutes port III which couples power in the 12 GHz band to the waveguide section 12 for propagation to port I.

One skilled in the art will appreciate that microwave power propagating through the waveguide section 12, is substantially to be confined to selected modes in order to prevent unwanted antenna horn pattern distortion. In the wideband diplexer 10 of the preferred embodiment, the desired mode for microwave power in the 4 GHz, 6 GHz and 12 GHz bands propagating within the waveguide section 12 is the $TE_{10}$ mode.

The band stop filter components and the band pass resonator components are electrically substantially transparent to signals in the 4 GHz and 6 GHz bands. Modes other than the $TE_{10}$ mode generally will not propagate in the 4 GHz or 6 GHz bands because of the waveguide section 12 being too narrow.

Furthermore, the height of the narrow walls 16 of the third step 36 is small enough such that this portion of the waveguide section 12 is substantially less than that required to progagate microwave power in the 12 GHz frequency band for unwanted $TE_{mn}$ and $TM_{mn}$ modes, where $n \neq 0$. Thus, the third step 36 represents a reduced height section wherein certain modes in the 12 GHZ band are below cut-off and therefore, are attenuated.

Additionally, the generally symmetrical distribution of each respective post 42 of the first set and each respective post 44 of the second set, substantially prevents scattering of unwanted modes in the 12 GHz band. For example, the $TE_{30}$ mode is not scattered because each of the respective resonant posts 42 and 44 are located where the transverse electric field is zero for the $TE_{30}$ mode, that is at one-third of the broad wall dimension from an adjacent narrow wall 16. As another example, the $TE_{20}$, $TE_{40}$ and $TE_{01}$ modes are not scattered due to the overall symmetry of the distribution of the respective resonant posts 42 and 44.

Figure 10:
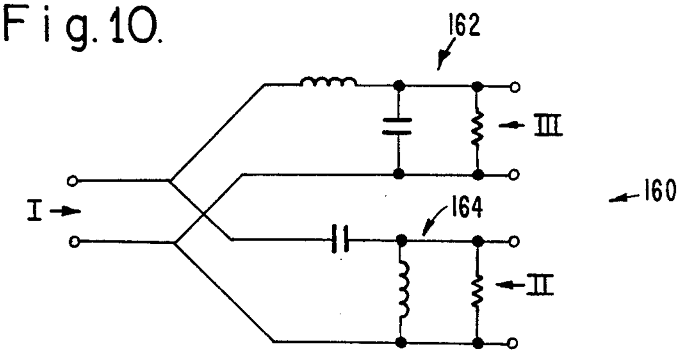
FIG. 10 is an illustrative electrical diagram which shows the electrical network upon which the embodiment of FIG. 1 is based.

Referring to the drawing of FIG. 10, there is shown an exemplary complementary filter 160 which illustrates by way of example the performance of the presently preferred wideband diplexer 10 with respect to microwave power in the 12 GHz band. The performance of the complementary filter 160 with regard to signals at zero frequency is analogous to the performance of the wideband diplexer 10 with regard to power in the 12 GHz band. More specifically, the complementary filter 160 comprises a high-pass section 162 and a complementary low pass section 164. The complementary filter 160 has a common port labeled I corresponding to port I of the wideband diplexer 10 which experiences a constant input impedance over all frequencies when a first input port labeled III corresponding to port III and a second input port labeled II corresponding to port II are terminated as shown.

Figure 11:
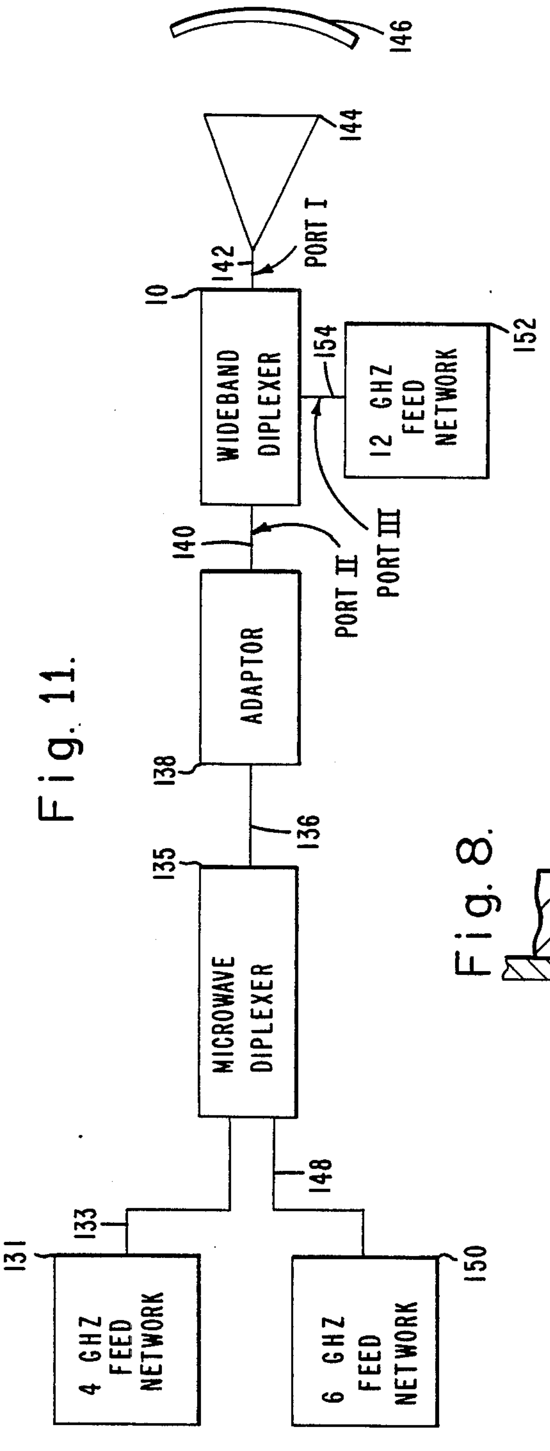
FIG. 11 is a block diagram which illustrates the embodiment of FIG. 1 in an operational environment.

The application of the wideband diplexer 10, to an operational environment will be appreciated from the following brief discussion with reference to FIG. 11. Signals in the 4 GHz band are processed in a 4 GHz band coaxial feed network 131 which will be understood by those skilled in the art. The 4 GHz band signals are provided on line 133 to a microwave diplexer 135 which, for example, can be of the type disclosed in U.S. Pat. No. 4,427,953 issued to Hudspeth et al, on Jan. 24, 1984 and whrch couples the 4 GHz signals to a coaxial transmission line 136 for transmission to a coaxial to transmission line adaptor 138 which, for example, can be of the type disclosed in U.S. Pat. No. 4,533,884 issued to Hudspeth et al, on Aug. 6, 1985 and which adapts the 4 GHz band signals from coaxial transmission line propagation to waveguide transmission. The adapter 138 provides the 4 GHz band signals on line 140 to port II of the wideband diplexer 10 of the present invention. The wideband diplexer 10 conducts the 4 GHz signals to its port I; whereupon the signals are provided to a feed horn 144 for transmission to an antenna reflector 146.

Signals in the 6 GHz band incident upon the reflector 146 are reflected to the feed horn 144 and are conducted on line 142 to port I of the wideband diplexer 10 of the present invention. The wideband diplexer 10 propagates the 6 GHz band signals to its port II whereupon the signals proceed on line 140 to the adaptor 138. The adaptor adapts the 6 GHz band signals from waveguide transmission to coaxial transmission line propagation and provides a 6 GHz band transmission line signal on line 136 to the microwave diplexer 135 which provides a 6 GHz band coaxial transmission line signal on line 148 to a 6 GHz band coaxial feed network 150 which will be understood by those skilled in the art.

Signals in the 12 GHz band are conducted from a 12 GHz band feed network 152 on line 154 to port III of the wideband diplexer 10 of the present invention. The 12 GHz band signals are provided to port I of the wideband diplexer 10; whereupon they are conducted on line 142 to the antenna feed horn 144 for transmission to the antenna reflector 146.

Therefore, the wideband microwave diplexer 10 of the present invention can couple microwave power in at least two microwave frequency bands which are relatively far apart in the frequency spectrum to a single port. Futhermore, the wideband microwave diplexer 10 substantially prevents the scattering or propagation of unwanted modes which could otherwise distort antenna patterns and disrupt signals carried by the microwave power propagating through the diplexer 10.

It will be understood that the above-described embodiment is merely illustrative of many possible specific embodiments which can represent the principles of the invention. Numerous and varied other arrangements can readily be devised in accordance with these principles without departing from the spirit and scope of the invention. For example, the resonant frequency of the first band pass resonator might be changed by altering the dimensions of the respective dipoles 112 and 112' and posts 114 and 114'. Thus, the foregoing description is not intended to limit the invention which is defined by the appended claims.

What is claimed is:

1. A microwave diplexer comprising:

(a) a waveguide section characterized by a rectangular cross-section and by opposed parallel broad walls and opposed parallel narrow walls, said waveguide section defining first and second longitudinally spaced apart ports, said waveguide section being adapted for propagating microwave power substantially within a first lower frequency band between said first port and said second port, said wave guide section defining a reduced height section between said first and second ports having a reduced spacing between said broad walls, said spacing being substantially less than that required for microwave power propagation of selected unwanted modes substantially within a second higher frequency band;

(b) a coupling resonator which depends from a coaxial center conductor and which is suspended within a launcher housing, said coupling resonator comprising;

(i) a first band pass resonator which includes first and second dipoles depending within said waveguide section, each of said dipoles heing spaced from the other and from a nearest waveguide section narrow wall by substantially one-third of a broad wall width dimension;

(ii) a second band pass resonator including first and second posts and a pin, said posts each separated from siad pin by substantially one-half wavelength of a mean center frequency of the second frequency band; and (iii) wherein first and second posts are spaced from one-another by substantially thc same spacing by which said first and second dipoles are spaced from one-another;

(iv) wherein said first and second posts and said pin are in electrical contact with said launcher housing; and (v) wherein said first and second band pass resonators are resonant at frequencies substantially within the second frequency band;

(c) first and second sets of resonant posts, depending within said waveguide section, each post of said first set being longitudinally spaced from each post of said second set by substantially an odd number of one-quarter waveguide wavelengths for the mean center frequency of the second frequency band, said first and second sets each comprising two posts extending from each of said broad walls, and each post being spaced substanitally one-third of a broad wall width dimension from a nearest of said narrow walls, said first and second sets substantially being electrically transparent to microwave power substantially within the first frequency band; and (d) transformer means in siad waveguide section for matching the impedance at said first port to the impedance at said second port.

2. A microwave diplexer comprising:

a waveguide section characterized by a longitudinal dimension and having a substantially rectangular cross-section, said waveguide section including opposed parallel broad walls and opposed parallel narrow walls and defining first and second longitudinally spaced ports for propagating microwave power substantially within a first lower frequency band between said first port and said second port;

coupling resonator means disposed between said first and second ports for coupling microwave power substantially within a second higher frequency band between said waveguide section and a coaxial transmission line;

a portion of said waveguide section adjacent to said coupling resonator means defining a reduced height section having a reduced spacing between said broad walls, said spaced being substantially less than that required for propagation of selected unwanted modes of microwave power in the second frequency band; and band stop filter means adjacent said second port for substnatially preventing microwave power substantially within the second higher frequency band from propagating to said second port.

3. The diplexer of claim 2 wherein the first frequency band is substantially 3.70 to 6.425 GHz; and the second frequency band is substantially 11.775 to 12.275 GHz.

4. The diplexer of claim 2 wherein said coupling resonator means comprises a band pass filter which depends from a center conductor of said coaxial transmission line and which is suspended within a launcher housing and which is resonant for microwave power substantially within the second frequency band.

5. The diplexer of claim 4 wherein said first and second ports are disposed at substantially opposite ends of said waveguide section.

6. The diplexer of claim 5 wherein siad band pass filter comprises first and second band pass resonators which are resonant substantially at the same frequency and have substantially the same bandwidth.

7. The diplexer of claim 6 wherein said first band pass resonator includes first and second dipoles depending from said center conductor within said launcer housing into said waveguide section; and wherein said first and second dipoles are spaced from one-another by substantially one-third of a broad wall dimension, said first dipole being spaced substantially one-third of the broad wall dimension from one narrow wall and said second dipole being spaced sibstantially one-third of the broad wall dimension from the other narrow wall.

8. The diplexer of claim 7 wherein said second hand pass resonator comprises first and second posts and a pin, said posts each separated from said pin by substantially one-half of the mean center frequency of the second frequency band; and wherein first and second posts are spaced from one-another by substantially the same spacing by which said first and second dipoles are spaced from one another; and wherein said first and second posts and said pin are in electrical contact with said launcher housing.

9. The diplexer of claim 8 wherein said first and second dipoles radiate microwave power substantially in phase.

10. The diplexer of claim 8 wherein respective flat springs provide electrical interfaces between said launcher housing and said respective first and second posts and said pin.

11. The microwave diplexer of claim 2 and further comprising impedance transformer means in said waveguide section for substantially matching the impedance at said first port to the impedance at said second port for microwave power substantially within said first lower frequency band.

12. The diplexer of claim 11 wherein a longitudinal dimension of the reduced height section is substantially one-quarter waveguide wavelength for the mean frequency of th first frequency band.

13. The diplexer of claim 11 wherein said band stop filter means comprises first and second band stop resonators within said waveguide section longitudinally spaced from one-another by substantially an odd number of one-quarter waveguide wavelengths at the mean frequency of the second frequency band.

14. The diplexer of claim 13 wherein said first and second band stop resonators each comprise a plurality of resonant posts depending within said waveguide section between said second port and said coupling resonator means.

15. The diplexer of claim 11 wherein said impedance transformer comprises a step transformer.

16. The diplexer of claim 15 wherein said step transformer includes a plurality of step sections longitudinally spaced along said waveguide section, each of said step sections having a longitudinal dimension of substantially one-quarter waveguide wavelength for the mean center frequency of the first frequency band.

17. The diplexer of claim 11 wherein said band stop filter means comprises first and second sets of four resonant posts each, each post depending within said waveguide section, each post of said first set being longitudinally spaced from a corresponding post of said second set by a substantially equal distance, said first and second sets each comprising two posts extending from each opposed parallel broad wall, and each post being spaced substantially one-third of a broad wall width dimension from a nearest of said narrow walls, said first and second sets substantially being electrically transparent to microwave power substantially within the first frequency band.

18. The diplexer of claim 17 wherein each post includes an enlarged head portion on top thereof.

19. The diplexer of claim 18 wherein each enlarged head portion comprises a disc.

20. The diplexer of claim 17 wherein said resonant posts of said first set and said resonant posts of said second set are longitudinally spaced by substantially an odd number of one-quarter waveguide wavelengths for the mean frequency of the second frequency band.

* * * * *